United States Patent [19]

Seki et al.

[11] 3,852,643

[45] Dec. 3, 1974

[54] PRINTED CIRCUIT BOARD ASSEMBLY AND HEAT SINK

[75] Inventors: Hideki Seki, Saijo; Sachinori Furuya, Ibaragi; Mamoru Hiroyasu, Saijo, all of Japan

[73] Assignee: Matsushita Electric Industrial Co., Ltd., Osaka, Japan

[22] Filed: Feb. 6, 1973

[21] Appl. No.: 330,099

[30] Foreign Application Priority Data

Feb. 7, 1972 Japan .............................. 47-13737

[52] U.S. Cl. .............................. 317/100, 174/DIG. 5

[51] Int. Cl. .............................................. H05k 7/20

[58] Field of Search ......... 317/100, 101 DH, 101 F; 174/DIG. 5, 16 R

[56] References Cited

UNITED STATES PATENTS

| | | | |
|---|---|---|---|
| 3,217,793 | 11/1965 | Coe | 174/16 R |
| 3,219,885 | 11/1965 | Schniers | 317/100 |
| 3,288,301 | 11/1966 | Kent | 317/101 DH |
| 3,355,540 | 11/1967 | Newell | 317/100 |
| 3,355,540 | 11/1967 | Newell | 317/100 |
| 3,567,998 | 3/1971 | Ammerman | 317/101 DH |
| 3,689,804 | 9/1972 | Ishihama | 317/100 |

OTHER PUBLICATIONS

Product Engineering, 6/10/63, pp. 96, 97, "8 More Printed–Circuits", Irwin N. Schuster.

Wakefield Engineering Inc., Bulletin 130 A, "Clamp Heat Sinks", pgs. 1–8, June 17, 1969, Wakefield, Mass.

*Primary Examiner*—Robert K. Schaffer
*Assistant Examiner*—Gerald P. Tolin
*Attorney, Agent, or Firm*—Stevens, Davis, Miller & Mosher

[57] ABSTRACT

A printed circuit board assembly comprising a radiation member which carries a heat dissipator such as a transistor and has opposite bent wall portions at its end portions, said bent wall portions being provided with a pair of grooves which are opposite to each other, and a printed circuit board having both edges thereof supported by being inserted in said pair of grooves. A printed circuit board may be readily mounted on and removed from the radiation member.

4 Claims, 4 Drawing Figures

PRINTED CIRCUIT BOARD ASSEMBLY AND HEAT SINK

BACKGROUND OF THE INVENTION

1. Field of the Invention

This invention relates to printed circuit board assemblies.

2. Description of the Invention

In the usual printed circuit board assembly, as typically shown in FIG. 4, a printed circuit board 2 is secured by machine screw 3 to metal frame 1. With this construction, however, a considerable time is required to mount or remove the printed circuit board. In another aspect, the particular use of the metal frame is uneconomical.

SUMMARY OF THE INVENTION

It is an object of the present invention to overcome the above disadvantages in the prior-art printed circuit board assembly by the provision of a novel structure, which permits ready mounting and removal of a printed circuit board and is very beneficial from an economic standpoint.

DESCRIPTION OF THE PREFERRED EMBODIMENT

Figures 1, 2, 3, 4:
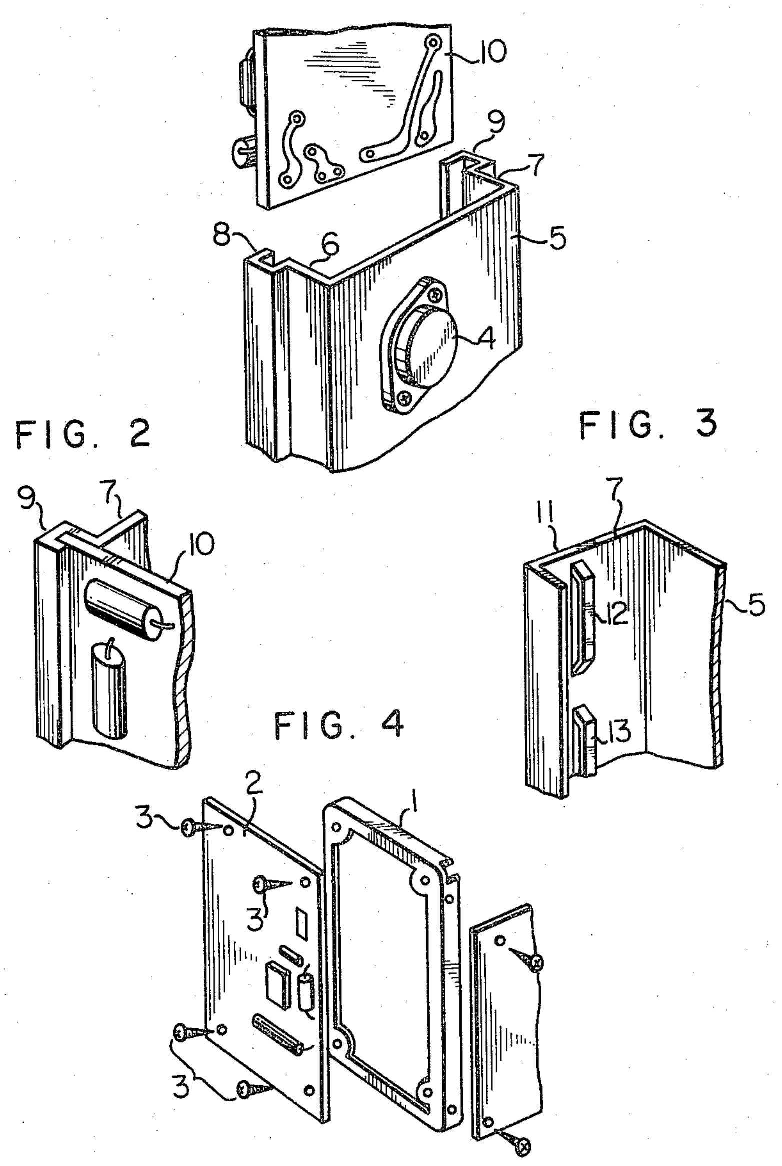
FIG. 1 is a fragmentary exploded perspective view of an embodiment of the printed circuit board assembly according to the invention.
FIG. 2 is a fragmentary perspective view of a part of the same assembly.
FIG. 3 is a fragmentary perspective view showing a part of another embodiment of the printed circuit board assembly.
FIG. 4 is a fragmentary exploded perspective view of the afore-mentioned typical prior-art printed circuit board assembly.

Referring now to FIG. 1, which shows an embodiment of the invention, there is shown a radiator member 5 carrying on a substantially flat portion a heat dissipator such as transistor 4. It has a channel-like shape, and its opposite side portions 6 and 7 are each bent along the edge into a further channel-shaped configuration so as to form grooves 8 and 9 opposing each other. The width of the grooves 8 and 9 is made slightly greater than the thickness of a printed circuit board 10 to be mounted, so that the printed circuit board may be readily fitted in the grooves. When the printed circuit board 10 is soldered by dipping, it slightly bows or warps, so that it tightly fits in the grooves 8 and 9, as shown in FIG. 2. When the printed circuit board 10 is thus mounted, it will not readily fall out but it will be firmly and stably fixed. The radiator plate 5 may usually be formed by extrusion molding aluminum or press stamping an aluminum plate. In the case of extrusion molding aluminum,, the grooves 8 and 9 may be readily formed by using a die having a required cross sectional configuration. The grooves may also be readily formed in the case of press stamping. FIG. 3 shows a different embodiment, whose radiator member 5 has opposite bent wall portions 6 and 7 each formed with inner protuberances 12 and 13 by press stamping. The functions of protuberances 12 and 13 are the same as those of grooves 8 and 9.

As has been described in the foregoing, according to the invention the radiator member for the heat dissipator such as a transistor is provided with opposing grooves to receive a printed circuit board, so that there is no need of particularly providing a frame or mount for mounting a printed circuit board, which is very beneficial in view of economy. Also, the printed circuit board may be readily mounted by merely fitting it in the grooves, and also it may be readily removed. Further the radiator wall portions constituting the opposing grooves for the mounting of the printed circuit board provide for an increased wall surface area, which is advantageous for heat radiaton. Furthermore, by providing the grooves adjacent the edges of the opposing walls of the radiator, generated heat will be transferred only a little and will not adversely affect the printed circuit board.

We claim:

1. A printed circuit board assembly comprising a radiator member of square shape carrying directly heat producing components, a pair of bent boards having a certain width formed by bending opposite ends of said radiator member, and a pair of grooves provided on said pair of opposing bent boards and having a width slightly greater than the thickness of a slightly curves printed circuit board, said slightly curved printed circuit board being attached to said radiator member by inserting opposite ends of said printed circuit board into said pair of grooves.

2. A printed circuit board assembly according to claim 1, wherein each of said grooves has a channel shape formed by bending an end portion of each of said bent boards.

3. A printed circuit board assembly according to claim 1, wherein each of said grooves comprises an end portion of said bent board further inwardly bent and inward projections provided in each of said bent boards.

4. A channel-shaped radiator member for assembly with a slightly curved printed circuit board comprising a flat portion carrying heat producing components on one surface thereof; and a pair of opposing side portions projecting from the ends of the other surface of said flat portion and formed integrally therewith by bending opposite ends of said flat portion, the opposing surfaces of said side portions each being provided with a groove having a width slightly greater than the thickness of said printed circuit board, said slightly curved printed circuit board being attached to said radiator member by inserting opposite ends of said board into the grooves in said opposing side portions, the slight curvature of said printed circuit board causing it to be retained firmly and stably within said grooves.

* * * * *